(12) United States Patent
Vaughan

(10) Patent No.: US 7,268,554 B2
(45) Date of Patent: Sep. 11, 2007

(54) RF COIL FOR IMAGING SYSTEM

(75) Inventor: John T. Vaughan, Stillwater, MN (US)

(73) Assignee: The General Hospital Corporation, Boston, MA (US)

( * ) Notice: Subject to any disclaimer, the term of this patent is extended or adjusted under 35 U.S.C. 154(b) by 0 days.

(21) Appl. No.: 10/367,489

(22) Filed: Feb. 14, 2003

(65) Prior Publication Data

US 2003/0146750 A1    Aug. 7, 2003

(51) Int. Cl.
*G01V 3/00*    (2006.01)
(52) U.S. Cl. .................. 324/322; 324/318; 333/227
(58) Field of Classification Search ............ 324/322, 324/318, 314, 300, 307, 309; 333/227, 228, 333/229, 235
See application file for complete search history.

(56) References Cited

U.S. PATENT DOCUMENTS

| | | | |
|---|---|---|---|
| 3,757,204 A * | 9/1973 | Hyde | .......................... 324/321 |
| 4,439,733 A | 3/1984 | Hinshaw et al. | |
| 4,463,328 A * | 7/1984 | Doty | .......................... 333/222 |
| 4,506,224 A | 3/1985 | Krause | |
| 4,590,427 A | 5/1986 | Fukushima et al. | |
| 4,602,234 A | 7/1986 | Butson | |
| 4,620,155 A | 10/1986 | Edelstein | |
| 4,634,980 A | 1/1987 | Misic et al. | |
| 4,680,548 A | 7/1987 | Edelstein et al. | |
| 4,686,473 A | 8/1987 | Chesneau et al. | |
| 4,691,163 A | 9/1987 | Blass et al. | |
| 4,692,705 A | 9/1987 | Hayes | |
| 4,694,255 A | 9/1987 | Hayes | |
| 4,712,067 A | 12/1987 | Roschmann et al. | |
| 4,714,887 A | 12/1987 | Meissner et al. | |
| 4,724,389 A | 2/1988 | Hyde et al. | |

(Continued)

FOREIGN PATENT DOCUMENTS

EP    0 366 188 A1    5/1990

(Continued)

OTHER PUBLICATIONS

Mickelson, A., "Active Antennas", *Wiley Encyclopedia of Electrical and Electronics Engineering Online*, Dec. 27, 1999 (article online posting date), www.mrw.interscience.wiley.com.

(Continued)

*Primary Examiner*—Louis M. Arana
(74) *Attorney, Agent, or Firm*—Crompton, Seager & Tufte LLC

(57) ABSTRACT

An RF coil suitable for use in imaging systems is provided which coil has a dielectric filled cavity formed by a surrounding conducting enclosure, the conducting enclosure preferably being patterned to form continuous electrical paths around the cavity, each of which paths may be tuned to a selected resonant frequency. The patterning breaks up any currents induced in the coil and shortens path lengths to permit higher frequency, and thus higher field strength operation. The invention also includes improved mechanisms for tuning the resonant frequency of the paths, for selectively detuning the paths, for applying signal to the coil, for shortening the length of the coil and for controlling the field profile of the coil and the delivery of field to the object to the image.

12 Claims, 6 Drawing Sheets

U.S. PATENT DOCUMENTS

| | | |
|---|---|---|
| 4,733,190 A | 3/1988 | Dembinski |
| 4,736,161 A | 4/1988 | Prevot et al. |
| 4,737,718 A | 4/1988 | Kemner et al. |
| 4,742,320 A | 5/1988 | Pfizenmaier et al. |
| 4,746,866 A | 5/1988 | Roschmann |
| 4,751,464 A | 6/1988 | Bridges |
| 4,763,076 A | 8/1988 | Arakawa et al. |
| 4,792,760 A | 12/1988 | Jacob et al. |
| 4,799,016 A | 1/1989 | Rezvani |
| 4,812,761 A | 3/1989 | Vaughan, Jr. |
| 4,812,764 A | 3/1989 | Bendall |
| 4,820,985 A | 4/1989 | Eash |
| 4,833,409 A | 5/1989 | Eash |
| 4,875,013 A | 10/1989 | Murakami et al. |
| 4,879,515 A | 11/1989 | Roemer et al. |
| 4,888,555 A | 12/1989 | Vaughan et al. |
| 4,916,418 A | 4/1990 | Rath |
| 4,928,064 A | 5/1990 | Keren |
| 4,939,465 A | 7/1990 | Biehl et al. |
| 4,952,878 A | 8/1990 | Mens et al. |
| 4,992,737 A | 2/1991 | Schnur |
| 5,017,872 A | 5/1991 | Foo et al. |
| 5,045,792 A | 9/1991 | Mehdizadeh |
| 5,049,821 A | 9/1991 | Duensing et al. |
| 5,053,711 A | 10/1991 | Hayes et al. |
| 5,055,853 A | 10/1991 | Garnier |
| 5,172,085 A | 12/1992 | Glenat et al. |
| 5,196,797 A | 3/1993 | Tropp |
| 5,212,449 A * | 5/1993 | Gentsch et al. ............. 324/316 |
| 5,221,902 A | 6/1993 | Jones et al. |
| 5,260,658 A | 11/1993 | Greim et al. |
| 5,277,183 A | 1/1994 | Vij |
| 5,304,932 A | 4/1994 | Carlson |
| 5,311,160 A | 5/1994 | Higuchi et al. |
| 5,349,297 A | 9/1994 | DeMeester et al. |
| 5,370,656 A | 12/1994 | Shevel |
| 5,381,122 A | 1/1995 | Laskaris et al. |
| 5,382,904 A | 1/1995 | Pissanetzky |
| 5,514,337 A | 5/1996 | Groger et al. |
| 5,530,355 A | 6/1996 | Doty |
| 5,539,315 A | 7/1996 | Cory et al. |
| 5,543,711 A | 8/1996 | Srinivasan et al. |
| 5,543,713 A | 8/1996 | Arakawa et al. |
| 5,557,247 A | 9/1996 | Vaughn, Jr. |
| 5,581,186 A | 12/1996 | Keller |
| 5,596,276 A | 1/1997 | Nakagawa et al. |
| 5,619,996 A | 4/1997 | Beresten |
| 5,744,957 A | 4/1998 | Vaughan, Jr. |
| 5,757,189 A | 5/1998 | Molyneaux et al. |
| 5,793,210 A | 8/1998 | Pla et al. |
| 5,886,596 A | 3/1999 | Vaughan, Jr. |
| 5,898,306 A | 4/1999 | Liu et al. |
| 5,903,198 A | 5/1999 | Weiss |
| 5,949,311 A | 9/1999 | Weiss et al. |
| 5,990,681 A | 11/1999 | Richard et al. |
| 5,998,999 A | 12/1999 | Richard et al. |
| 6,008,649 A | 12/1999 | Boskamp et al. |
| 6,023,166 A | 2/2000 | Eydelman |
| 6,029,082 A | 2/2000 | Srinivasan et al. |
| 6,040,697 A | 3/2000 | Misic |
| 6,054,854 A | 4/2000 | Kawamoto |
| 6,060,882 A | 5/2000 | Doty |
| 6,133,737 A | 10/2000 | Greim |
| 6,150,816 A | 11/2000 | Srinivasan |
| 6,201,392 B1 | 3/2001 | Anderson et al. |
| 6,215,307 B1 | 4/2001 | Sementchenko |
| 6,232,779 B1 | 5/2001 | Tropp et al. |
| 6,236,206 B1 | 5/2001 | Hartman et al. |
| 6,323,779 B1 | 11/2001 | Murakami et al. |
| 6,369,570 B1 | 4/2002 | Wong et al. |
| 6,396,271 B1 | 5/2002 | Burl et al. |
| 6,420,871 B1 | 7/2002 | Wong et al. |
| 6,501,274 B1 | 12/2002 | Ledden |
| 6,535,084 B1 | 3/2003 | Tropp |
| 6,633,161 B1 | 10/2003 | Vaughan, Jr. |
| 2006/0033501 A1 | 2/2006 | Vaughan, Jr. |

FOREIGN PATENT DOCUMENTS

| | | |
|---|---|---|
| EP | 0 290 187 A2 | 11/1998 |
| JP | 60-128339 | 7/1985 |
| JP | 03032365 | 9/1992 |
| JP | 04-364003 | 12/1992 |
| JP | 08257011 A | 10/1996 |
| WO | WO99 54759 A1 | 10/1999 |
| WO | WO 00 72033 A2 | 11/2000 |

OTHER PUBLICATIONS

Sarkar et al., "Stripline Components", *Wiley Encyclopedia of Electrical and Electronics Engineering Online*, Dec. 27, 1999 (article online posting date), www.mrw.interscience.wiley.com.

Tropp, J et al., "The prospects for systematic design of TEM resonators", *Proceedings of the International Society for Magnetic Resonance in Medicine*, May 22-28, 1999, Seventh Scientific Meeting and Exhibition, , vol. 1, Philadelphia.

Tropp, J., "Mutual inductance in the bird-cage resonator", *Journal of Magnetic Resonance*,1997, vol. 126, pp. 9-17.

Tsutsumi et al, "Nonlinear Behavior of Electromagnetic Waves in the Yig Film Microstrip Line", *IEEE MTT*, 1998, pp. 841-844.

Vaughan et al., "An Improved Volume Coil for High Field MRI", *Proceedings of the International Society for Magnetic Resonance in Medicine*, May 22-28, 1999, p. 167, Seventh Scientific Meeting and Exhibition, Philadelphia.

Vaughan et al., "High Frequency Volume Coils for Clinical NMR Imaging and Spectroscopy", *Magnetic Resonance in Medicine*, 1994, pp. 206-218, vol. 32.

Vaughan et al., "The Head Cradle: An Open Faced, High Performance TEM Coil", The University of Minnesota Center for Magnetic Resonance Research, 1999, Minneapolis.

Wen, H. et al., "The Design and Test of A New Volume Coil for High Field Imaging", *Magnetic Resonance in Medicine*, Oct. 1, 1994, pp. 492-498, vol. 32, No. 4.

Zhang et al., "Microstrip RF Surface Coil Design for Extremely High-Field MRI and Spectroscopy", *Magnetic Resonance in Medicine*, 2001, pp. 443-450, vol. 46.

Bioengineering, Inc./HF Imaging, LLC, Brochure.

Adriany et al., "Shielded Surface Coils and Halfvolume Cavity Resonators for Imaging and Spectroscopy Applications at 7 Tesla", *Proceedings of the International Society for Magnetic Resonance in Medicine*, Apr. 1-7, 2000, p. 563, Eighth Scientific Meeting and Exhibition, Denver, Colorado.

Ballon et al., "A 64 MHz Half-Birdcage Resonator for Clinical Imaging", *Journal of Magnetic Resonance*, 1990, pp. 131-140, vol. 90.

Dürr et al., "A Dual-Frequency Circularly Polarizing Whole-Body MR Antenna for 69/170 MHZ", *Magnetic Resonance in Medicine*, Jun. 1, 1991, pp. 446-455, vol. 19, No. 2.

Dravin et al., "Measurements of the Effective Electrodynamical Parameters of Nb Microstrip Resonator", *Physica*, 2000, pp. 2675-2676, vol. C.

Gasson et al, "Modified Birdcage Coils for Targeted Imaging", *Magnetic Resonance Imaging*, 1995, pp. 1003-1012, vol. 13, No. 7.

Gupta et al., "Microwave Circuits", *Wiley Encyclopedia of Electrical and Electronics Engineering Online*, Dec. 27, 1999 (article online posting date), www.mrw.interscience.wiley.com.

How et al., "Microstrip Antennas", *Wiley Encyclopedia of Electrical and Electronics Engineering Online*, Apr. 28, 2000 (article online posting date), www.mrw.interscience.wiley.com.

Kim et al., "Miniature Magnetic Resonance Spectrometers", 16th DASC AIAA/.EEE Digital Avionics Systems Conference, 1997.

Ledden et al., "An Four Port Drive Flat-Element Transmission-Line Coil for Brain Imaging at 3T", *Proceedings of the International Society for Magnetic Resonance in Medicine*, Apr. 1-7, 2000, p. 1395, Eighth Scientific Meeting and Exhibition, Denver, Colorado.

Ledden et al., "Use of a Transmission Line Resonator as a Volume Phased Array", *Proceedings of the International Society for Magnetic Resonance in Medicine*, Apr. 1-7, 2000, p. 1396, Eighth Scientific Meeting and Exhibition, Denver, Colorado.

Lee et al., "Planar Strip Array Antenna for Parallel Spatial Encoded MRI", *Wiley Encyclopedia of Electrical and Electronics Engineering Online*, 1999, www.mrw.interscience.wiley.com.

Ma et al., "Microstrip Lines", Wiley Encyclopedia of Electrical and Electronics Engineering Online.

\* cited by examiner

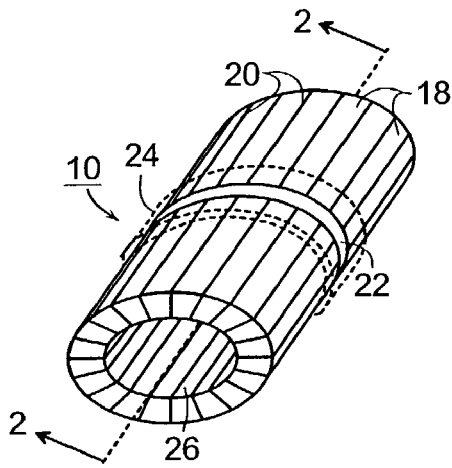
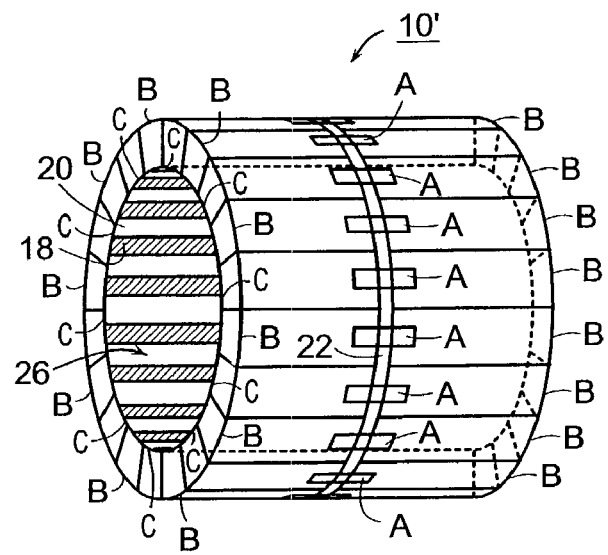
FIG. 1A
FIG. 1B
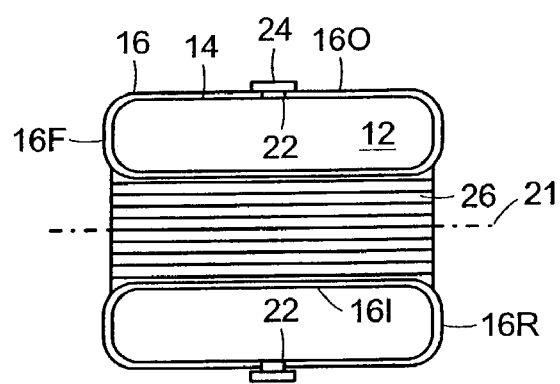
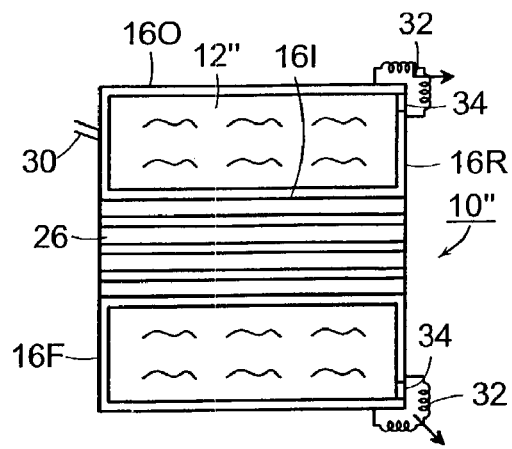
FIG. 2A
FIG. 2B

RF COIL FOR IMAGING SYSTEM

RELATED APPLICATIONS

This application claims the benefit of U.S. patent application Ser. No. 09/575,384, filed May 22, 2000 now U.S. Pat. No. 6,633,161, entitled "RF Coil for Imaging System," by J. T. Vaughan, which application claims the benefit of U.S. Provisional Patent Application Ser. No. 60/135,269, filed May 21, 1999, entitled "RF Coil for Imaging System and Use Therein," by J. T. Vaughan, each of which is incorporated herein by reference.

FIELD OF THE INVENTION

This invention relates to imaging systems employing radio frequency (RF) coils for RF field generation, and more particularly to RF coils for use in such systems which coils facilitate higher frequency, higher efficiency, higher energy operation, permit use of larger coils, facilitate flexibility in coil design to accommodate a variety of applications and provide enhanced signal-to-noise performance so as to achieve among other things improved MRI, fMRI and MR spectroscopic imaging, all the above being achieved without significant increase in cost. The invention applies similarly to EPR or ESR.

BACKGROUND OF THE INVENTION

Nuclear magnetic resonance (NMR) or magnetic resonance imaging (MRI), functional MRI (fMRI), electron spin resonance (ESR) or electron paramagnetic resonance (EPR) and other imaging techniques using RF field generating coils are finding increasing utility in applications involving imaging of various parts of the human body, of other organisms, whether living or dead, and of other materials or objects requiring imaging or spectroscopy. For purposes of this application, RF shall be considered to include frequencies from approximately 1 MHz to 100 GHZ, the upper ranges of which are considered to be microwaves. While existing such systems are adequate for many applications, there is often a need for higher signal-to-noise and improved spectral resolution in such imaging so as to permit higher spatial resolution, higher image contrast, and faster imaging speed. In fMRI applications for example, where multiple images may be taken over time and a difference image generated to permit visualization of small changes in blood oxygen use over time in the body being imaged, differences between successive images may be very small, requiring high signal-to-noise to permit detection. A major limitation to higher resolution, and/or faster imaging is an insufficient signal to noise ratio. If the image signal intensity is below the noise level, an image can not be made. It is therefore important in high resolution systems to design an RF coil to maximize signal and to minimize noise. The RF coil of such a system should also be designed to minimize eddy currents propagating therein which are induced by time transient currents in gradient coils or by other causes.

The signal-to-noise ratio (SNR) and spectral resolution are increased by increasing the magnetic field strength of the system, generally expressed in tesla (T). The SNR benefits of image speed, spatial resolution, and contrast are also increased with the magnetic field strength. However, the frequency of which the nuclei of atoms in the body resonates varies as a function of the applied magnetic field, with each atomic species having a unique magnetic field dependent resonant frequency referred to as the Larmor frequency. For the human body which is composed primarily of hydrogen atoms in water, fat and muscle tissue, these hydrogen nuclear (proton) frequencies are approximately 64 MHZ for a field strength of 1.5 T, 170 MHZ (4 T), 175 MHZ (4.1 T), 300 MHZ (7 T), 340 MHZ (8 T) and 400 MHZ (9.4 T). Other species of atomic nuclei in a body would resonate at other frequencies for a given field strength. However, while conventional birdcage coils in existing MRI and related systems might resonate at a frequency of 170 MHZ (4 T) for example, the conventional birdcage coil with lumped elements (reactance) will operate very inefficiently, radiating much of its energy like an antenna, rather than conserving its energy like a "coil". At higher frequencies still, such lumped element coils of human head or body dimensions will not reach the Larmor resonant frequency required, limiting the magnetic field strength at which such MRI or EPR systems can operate. Further, since frequency is a function of the electrical path lengths (measured in wavelengths) in the RF coil, higher frequency, and thus higher field strength operation, has been previously achievable only with very small coils which are not always useful for imaging a human being or other larger objects. A need therefore exists for an RF coil design which provides short electrical path lengths and shields against radiative losses, while still permitting an RF coil to be constructed with physical dimensions sufficient to image a human body and/or other larger objects with high frequency RF energy, thus permitting high field strength operation. It is also desirable to be able to tune each path of an RF coil to a precise resonant frequency, to be able to provide two or more resonant frequencies for different paths on the coil, and to be able to easily adjust/retune the resonant frequency of a path or paths.

Still another potential problem in operating these imaging systems, especially at high fields, is in driving the RF coil in a manner so as to achieve a homogeneous RF field, even when a body is positioned in the field, or to achieve some other desired field profile. Many factors influence field profile or contours including the manner in which the coils are driven, the geometric and frequency dependent electrical properties of the anatomy or object, and the frequency dependent properties of the coil circuits. Techniques for controlling these and other factors to achieve a homogenous or other desired field profile are therefore desirable. Also, while in many systems the same coil is used for both the transmitting of RF energy and the receiving thereof, the coils being switched between transmit and receive circuitry, there are many applications where the homogeneous excitation of NMR signal is achieved with a large volume coil and a small local receive coil having very short path lengths is used for achieving high SNR operation, such local receive coil being placed as close to the region of the body being imaged as possible. However, having both the large transmit coil and the local RF receive coil tuned to the same frequency results in the coils being destructively coupled (by Lenz's Law for example), this defeating enhanced operation from the local receive coil. It is therefore desirable to be able to quickly detune the large RF transmit coil during a receive operation by a local RF receive coil and vice versa. Improved ways of achieving this objective, particularly in an RF coil providing the characteristics previously indicated, are therefore desirable.

Finally, some of the advantages of having a local receive coil, and in particular the ability to place the RF coil closely adjacent to a region where imaging is desired, could be achieved if the RF coil were designed so as to localize both the transmission and reception of RF energy. While coils adapted for performing this function in certain specialized situations have existed in the past, a more general purpose design for RF coils to facilitate their use in producing localized RF fields and the localized reception of RF (NMR) signal, is desirable in order to achieve the enhanced SNR benefits of higher image signal, resolution, speed and contrast.

While some of the advantages indicated above are achieved by distributed impedance RF coils disclosed in U.S. Pat. Nos. 5,557,247 and 5,744,957, which patents have the same inventor as this invention, the systems taught in these patents, and in particular the RF coils thereof, do not provide optimum performance in all situations, and improvements are possible on various aspects of these RF coils, including eddy current suppression, design of the coil for optimum positioning in a greater number of cases, improved control of field profile, improved tuning options and improved detuning in situations where the use of two or more coils is desired.

SUMMARY OF THE INVENTION

In accordance with the above, this invention provides an RF coil for use in an imaging system, which coil has a cavity formed as a conductive enclosure in which resonant field can be excited, the enclosure being formed at least in part of an electrical conductor patterned to form RF conductive paths around the cavity. At least one tuning mechanism may be provided which determines a resonant frequency or frequencies for such paths. The tuning mechanism may be fixed, resulting in a preselected resonant frequency for the path, or variable to provide a tunable resonant frequency or frequencies. The tuning mechanism may reactively adjust the electrical length of each path to tune the path. The path reactance may also be adjusted to achieve a selected field profile for the coil. The tuning mechanism may tune all the paths to the same resonance frequency or may selectively tune the paths to resonate at two or more different frequencies. In particular, alternate ones of the paths may be tuned to resonate at a first frequency and the remaining ones of the paths tuned to resonate at a second frequency.

The coil may also include a dielectric which at least substantially fills the cavity the thickness of the conductor for at least selected portions of the enclosure maybe substantially greater than one skin depth at the resonant frequency, the dielectric filling the cavity having a dielectric constant different from that of air. This results in signals of different frequencies propagating on the outer and inner surfaces of the conductor.

Each of the N paths on the coil may have at least one non-conductive gap formed therein, and the tuning mechanism may include a reactance and/or an impedance across at least selected ones of said gaps. The reactance/impedance for at least selected ones of the gaps may be variable to control the resonant frequency for the corresponding path. The reactance for at least some embodiments includes a capacitor, the capacitance of which may be varied and/or an inductor the inductance of which may be varied. The variable impedance and/or reactance may be controlled to tune, retune and/or detune the path in which it is located. Where the enclosure is formed of an outer wall, inner wall, and side walls, end conductive lands may be formed on each of the walls, with corresponding lands on each wall being connected to form the paths and the gaps being formed in the conductor for each of the paths for at least one of the walls. For some embodiments, the gaps are formed in the outer wall conductor for each path.

The resonant frequency of the paths may be determined by distributed capacitance and distributed inductance for the path, the distributed capacitance being determined by the area of the electrical conductor for each path, a dielectric fill material for the cavity and/or the dimensions of the dielectric fill material. The electrical conductor forming each path may be a thin foil, the distributed inductance for the path being a function of the path length. At least one reactance component may be provided in at least selected ones of the paths, the reactance component being either distributed or lumped. A distributed or discrete reactance may be selected to achieve a desired resonant frequency for the paths. The paths have a cumulative reactance which includes at least in part the distributed capacitance/inductance, the cumulative reactance for the paths being tuned to result in D different resonant frequencies for the coil, every Dth path symmetrically spaced around the coil being tuned to the same frequency.

The coil may include a circuit which applies RF signal to and/or receives RF signal from M selectively spaced ones of said paths, where M is an integer and $1 \leq M \leq N$. The RF signals may be phase shifted corresponding to a phase shift for the corresponding paths to provide circular or other polarization for the coil. Each RF signal is preferably reactively coupled to the corresponding path, the coupling reactance for each path being variable for some embodiments to independently match/tune the path. In particular, the coupling reactances may be impedance matched to different loading conditions for the coil. For some embodiments, the RF coil may be used to transmit and/or receive RF signals, but not both simultaneously, and includes a detuning mechanism for the paths, the detuning mechanism being operative when the RF coil is not in the one of the transmit/receive modes for which it is being used. The detuning mechanism may include a mechanism for altering the path length and/or impedance for each path to be detuned, and in particular may include for some embodiments a PIN diode circuit for each path which facilitates rapid switching to a changed impedance state sufficient to effect the path detuning. Alternatively, the RF drive signals may be phase-shifted corresponding to the phase shift for the paths to which they are applied to provide circular polarization for the coil, the detuning mechanism including circuitry which reverses the phase of the RF drive signals.

For an enclosure which is formed of an outer wall, inner wall, and side walls, within conductive lands being formed for each wall, corresponding lands on each wall being connected to form the paths, at least the outer wall may have two conductive layers separated by a dielectric, the two conductive layers each being slotted to form a pattern of lands, with slots on each layer being overlaid by lands of the adjacent layer. The degree of overlap for the lands of said layers is at least one factor controlling coil resonant frequency.

At least one of the side walls may also have an aperture through substantially the center thereof through which a body to be analyzed may be passed to an area inside the inner wall, the conductive layer on the inner wall being patterned to provide a selected magnetic flow pattern in said aperture. One of the side walls may also be closed, the closed side wall being slotted to form a land pattern covering at least most of the wall.

The imaging system may also have at least one gradient coil which induces low frequency eddy currents in the RF coil, the slotting on at least the outer wall and side walls resulting in the breaking up of and substantial attenuation of such eddy currents without substantial attenuation of RF currents and fields. The electrical conductor for at least the outer wall and side walls may be a conductive layer which is thin enough to attenuate low frequency eddy currents while still conducting RF currents. For such embodiment, the conductor layer has a thickness substantially equal to one skin depth at the resonance frequency to which the coil is tuned, which thickness is substantially equal to approximately 5 microns for an illustrative embodiment.

For some embodiments, each of the paths has at least one circumferential/azimuthal slot formed therein to break the path into smaller paths. A fixed, variable and/or switched reactive coupling and/or an impedance coupling may be connected across each of the circumferential slots. Where a reactive coupling is utilized, such coupling is a capacitive coupling for illustrative embodiments.

An RF drive signal input is provided to at least one of the paths, the path inductively coupling an RF drive signal and a path to adjacent paths.

The dielectric material filling the cavity may provide a selected path capacitance, and thus a selected resonant frequency. A mechanism may be provided for controlling the dielectric fill of the cavity and thus the resonant frequency of the coil.

The electrical conductor may be patterned to form N conductive lands for the enclosure, each of a selected width, and the number N of conductive paths and the width of conductive lands for each path may be selected to achieve a desired resonant frequency and a desired field contour.

The enclosure is preferably formed to break induced eddy currents and/or to shape the RF magnetic field patterns.

For some embodiments, a lid is mounted to at least one end of the coil. The lid may be conductive, non-conductive or segmented to be partially conductive. A plurality of sample spaces may also be formed in the dielectric at a selected portion of the enclosure, such portion being one of the side walls for an illustrative embodiment. The sample spaces extend at least part way into the dielectric from the side wall. Alternatively, the open center chamber or aperture of the coil may contain a dielectric which preferably fills such chamber and a plurality of sample spaces may penetrate such dielectric. At least a portion of at least selected ones of the paths may be formed as conductive tubes or coaxial tube conductors.

For embodiments having a close end wall, the closed end wall functions as an RF mirror, the end wall having a radial slotting pattern covering at least most of the wall for an embodiment where the electrical conductors for each wall are slotted.

For some embodiments, field applied to at least one of the electrically conducting paths causes an alternating magnetic field in the cavity and at least one aperture is formed in at least the electrical conductor through which magnetic field may be applied to an adjacent body. For some such embodiments, the coil is shaped to conform to the body being imaged, the surrounding walls including connected top and bottom walls, with the at least one aperture being formed in only the bottom wall. The coil may be flexible to conform to a surface of a body being imaged and the at least one apertures may be arranged to be adjacent the areas to be imaged of the body being imaged. Where the areas to be imaged are at least one projection on a body, such projection may extend into the cavity through an adjacent aperture. For such embodiments, the dielectric may be conformable to an outer surface of a projection extending into the cavity so as to minimize discontinuity between the projection and the dielectric. Where the coil is formed is a closed loop, an aperture may be formed in only one of an inner or outer wall of the coil. Apertures may be arranged to be adjacent areas to be imaged of a body being imaged.

Various features of the invention, such as the detuning mechanism, may be employed independent of other features of the invention. Another potentially independent feature is the dielectric material filling the cavity being utilized to control the resonant frequency for one or more of the paths. In particular, the dielectric material may be different in different areas of the cavity so as to selectively shape the coil field. A mechanism may also be provided for controlling the dielectric fill of the cavity and thus the resonant frequency of the coil, for example the amount of fluid in the cavity being controlled where a fluid dielectric is employed. Acoustic damping material may also be provided as a fill for at least a portion of the cavity. A dielectric material may also be selectively positioned between the coil and a body to be imaged to control and/or shape the field applied to the body from the coil. The dielectric material preferably substantially fills the space between the coil and at least a selected area of the body, the dielectric constant of the dielectric substantially matching that of the body in such area. Where a selected area is the area to be imaged, the dielectric concentrates and directs the field to such area. In its broadest sense, the invention includes a conductive enclosure which is patterned to suppress low frequency currents and EMI noise.

In accordance with still another aspect of the invention, the RF coil includes a cavity formed by at least an inner and an outer conductor, a dielectric material filling the cavity and at least one sample space formed in the coil. The sample space may for example be formed in the dielectric material, projecting therein from a wall of the enclosure. For some embodiments, the coil is a transmission line stub, the inner and outer conductor of the coil being the inner and outer conductors of the transmission line stub, respectively. A conductive cap may short one end of the transmission line stub. The sample space is preferably located at a distal end of the stub, the sample space extending from such distal end into the dielectric material or a hollowed-out portion of the center conductor. The stub is tuned and matched so that maximum current, and therefore maximum RF field, occur at such distal end.

The foregoing and other objects, features and advantages of the invention will be apparent in the following more particular description of preferred embodiments of the invention as illustrated in the accompanying drawings.

IN THE DRAWINGS

FIGS. 1A and 1B are perspective views of RF coils in accordance with illustrative embodiments of the invention.

FIG. 2A is a sectional view taken generally along the line 2-2 of FIG. 1A.

FIG. 2B is the same sectional view as FIG. 2A, but for an alternative illustrative embodiment.

Figure 3A:
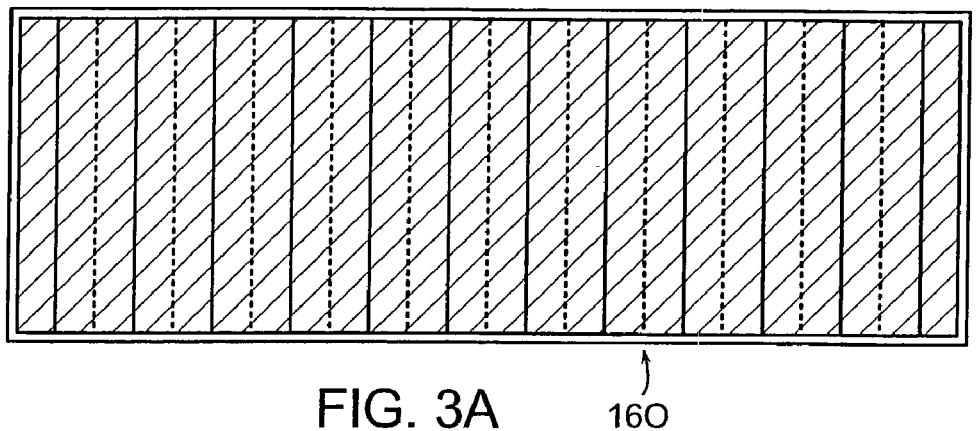
FIGS. 3A and 3B are illustrations of slotted conductor configurations for an outside wall and an inside wall, respectively, of an illustrative coil having double-sided conductor clad dielectric substrate on both walls.
Figure 3B:
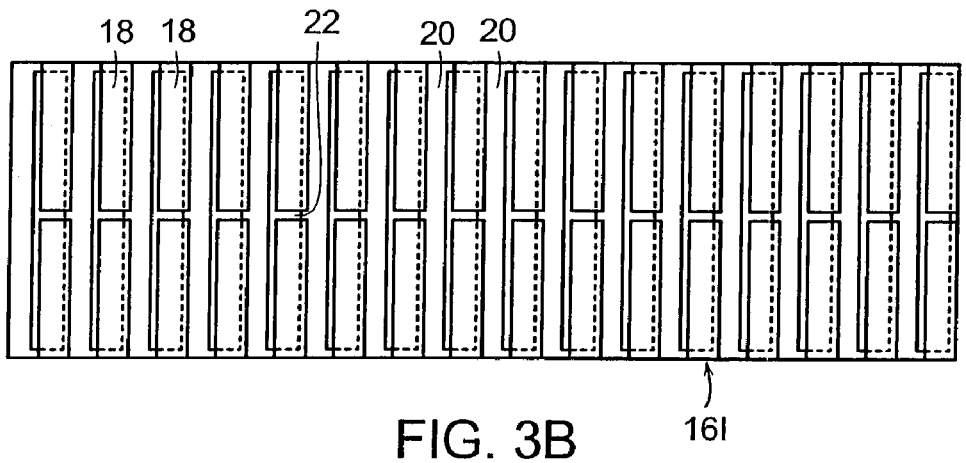
Figure 4A:
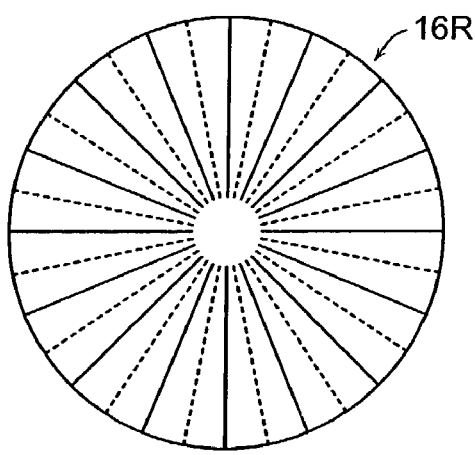
Figure 4B:
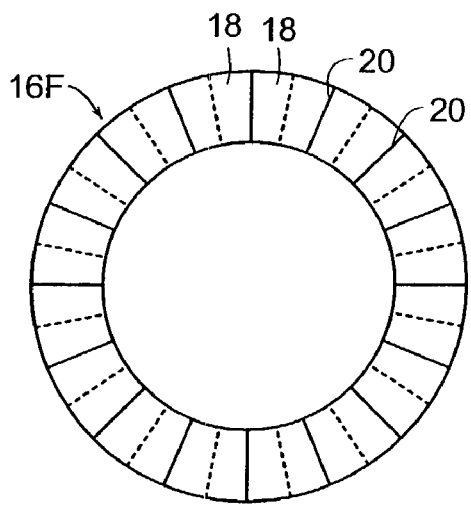

FIGS. 4A and 4B are illustrations of slotted conductor patterns for the back wall and front wall, respectively, of an illustrative coil embodiment having double-sided conductors on each of these walls and a closed back wall. The front and back end walls of FIGS. 4A and 4B are preferably utilized in conjunction with the inside and outside walls of FIGS. 3A, 3B or of FIGS. 3C, 3D to form a conductor pattern for an RF coil embodiment.

Figure 5A:
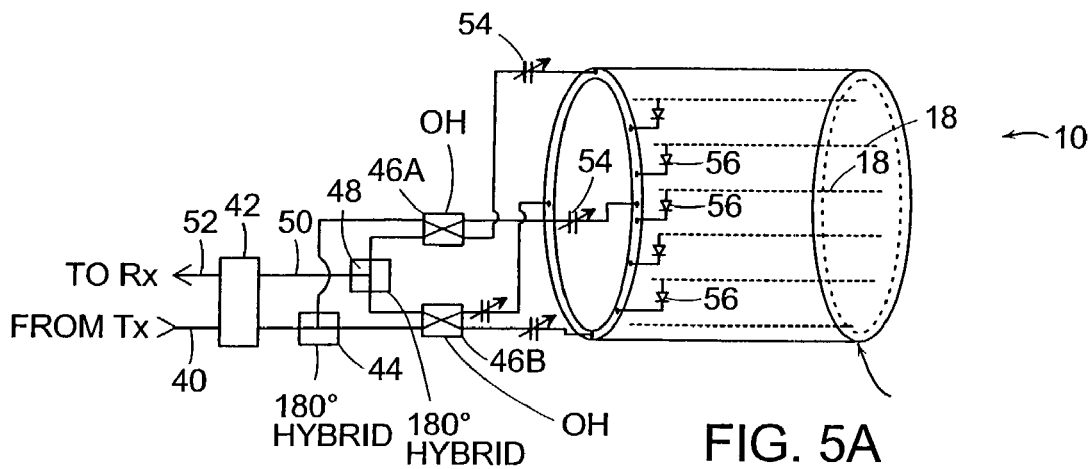

FIG. 5A is a semi-schematic diagram of a coil for an illustrative embodiment illustrating a novel drive mechanism for such coil and a novel detuning mechanism for the coil.

Figure 5B:
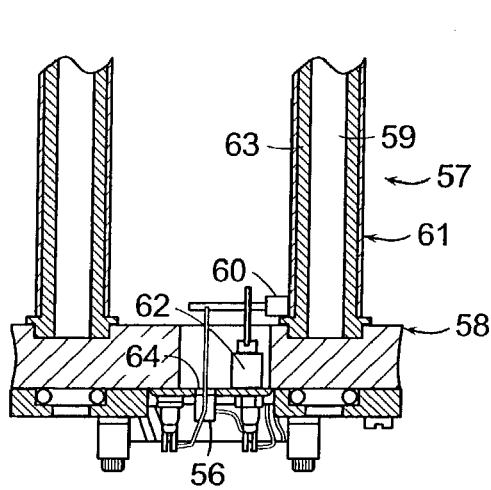

FIG. 5B is an enlarged schematic view of a detuning circuit for an embodiment.

Figure 6:
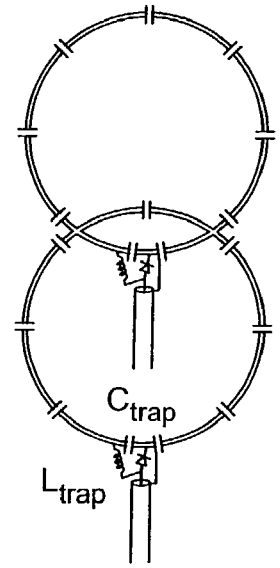

FIG. 6 is a top perspective view of a receiver coil illustrating detuning mechanism.

Figure 7A:
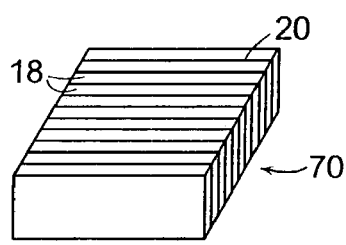
Figure 7B:
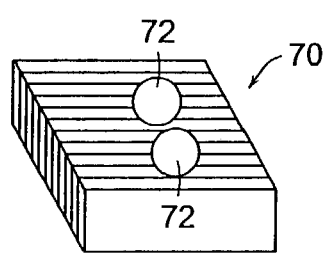

FIGS. 7A and 7B are a top perspective and bottom perspective view, respectively, of an RF coil for another embodiment of the invention.

Figure 8:
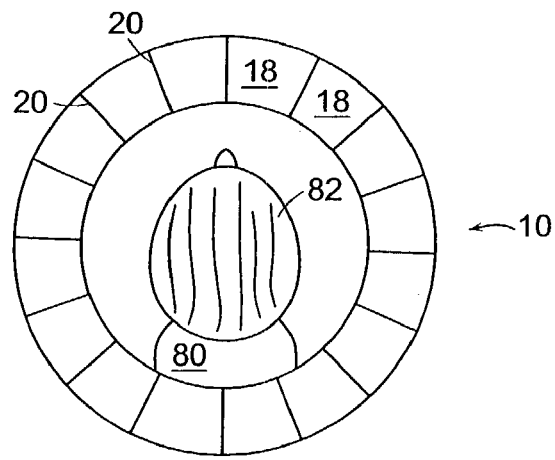

FIG. 8 is a planar rear view of a coil in accordance with the teachings of this invention with a patient therein and a field "focusing" dielectric pillow.

Figure 9A:
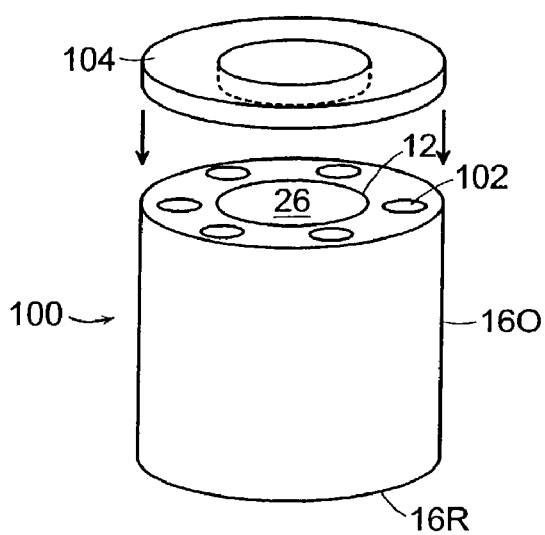
Figure 9B:
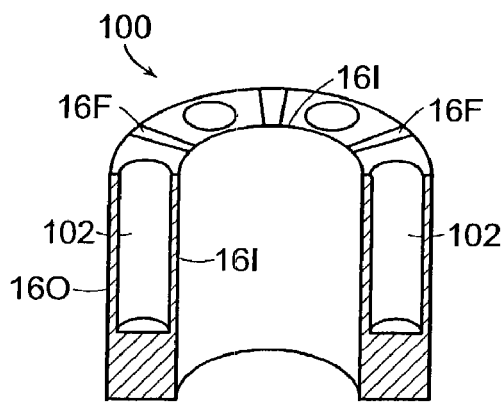
Figure 9C:
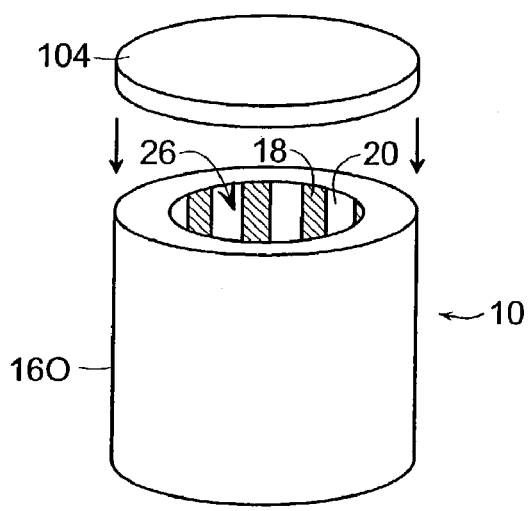
Figure 9E:
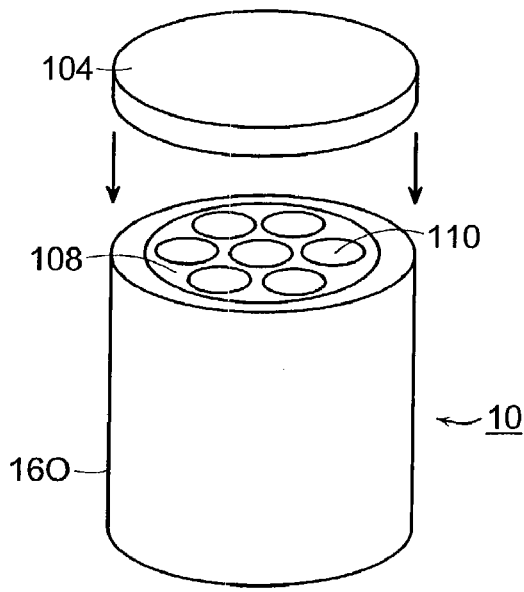
Figure 9D:
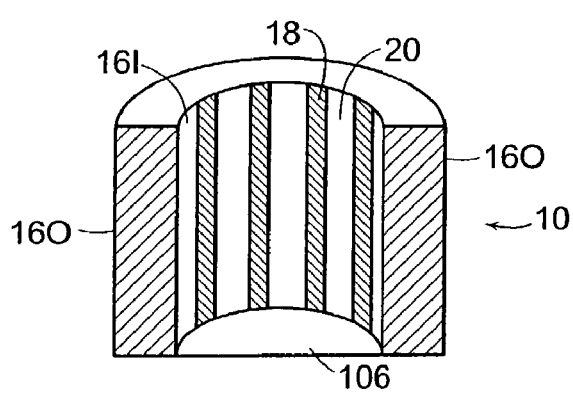
Figure 9F:
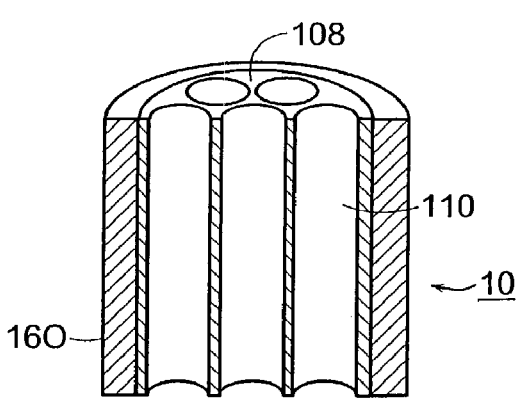

FIGS. 9A, 9C and 9E are perspective views of three additional embodiments of the invention and FIGS. 9B, 9D and 9F are sectional views of FIGS. 9A, 9C and 9E, respectively.

Figure 10A:
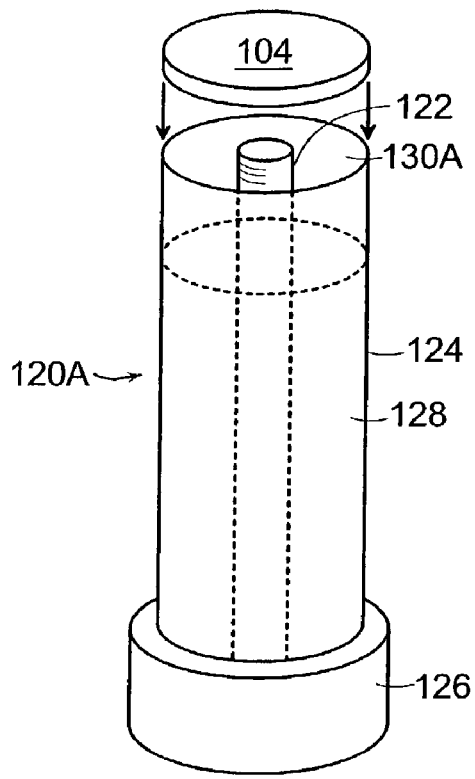
Figure 10B:
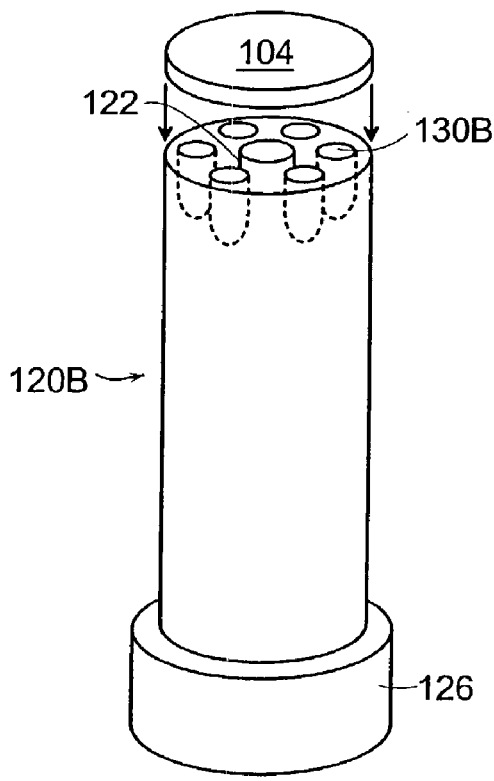
Figure 10C:
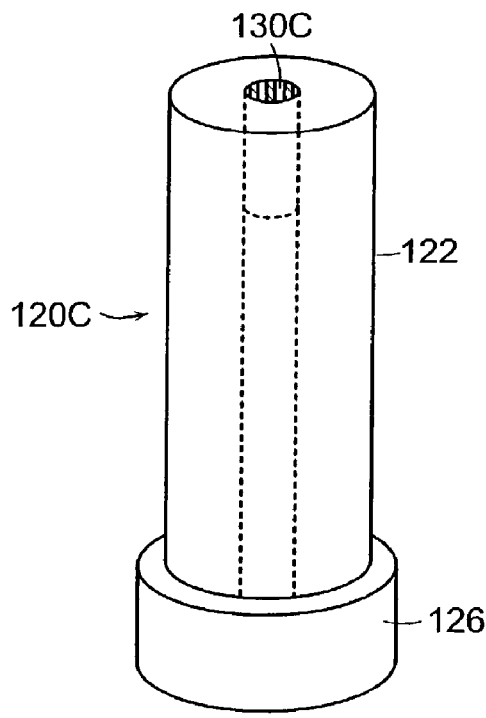

FIGS. 10A-10C are perspective views of three coaxial stub embodiments of the invention.

Figure 10D:
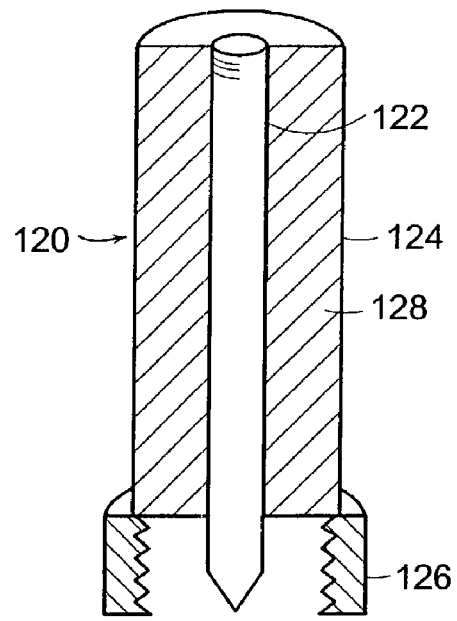

FIG. 10D is a cross-sectional view of a generalized coaxial stub embodiment.

DETAILED DESCRIPTION

FIGS. 1A and 2A show an illustrative embodiment of the invention which overcomes many of the problems discussed earlier. In particular, the RF coil 10 shown in these figures has a conducting cavity formed as a conductive enclosure 12 in which resonant field can be excited, the enclosure being formed by a surrounding, conducting wall 16, which wall may be supported by a non-conducting wall 14. Conducting wall 16 may be a whole wall which is at least selectively patterned as described later, or may be formed of conducting tubes, coaxial tubes as in the U.S. Pat. No. 5,557,247 or other appropriate spaced components. Cavity/enclosure 12 is filled with air or another dielectric material and supporting wall 14 may also be formed of a dielectric material having a dielectric constant which substantially matches that of the material in cavity 12. Cavity 12 may also be defined by a solid piece of dielectric material of the appropriate shape.

The enclosure or cavity 12 may have a circular (FIG. 1B) or elipsoidal (FIG. 1A) transaxial cross-section for many applications, and an elongated axial cross-section, shown for example in FIG. 2A or FIG. 2B, so that the cavity has an outer conducting wall 16O, an inner conducting wall 16I, a front conducting wall 16F, and a rear conducting wall 16R. (1a, b5a, bDisclosure) As indicated above, each of the conducting walls 16 may be supported by a corresponding non-conducting wall 14, or only selected ones of the conducting walls may be so supported. In accordance with the teachings of this invention, each of the conductor walls 16O, 16I, 16F, 16R is slotted or otherwise patterned to form a plurality of lands 18 separated by nonconducting slots 20. While in the figures, the slots 20 are shown as being substantially parallel to each other and to the axis 21 (FIG. 2A) of the coil in each of the inner and outer walls, and continuous with substantially radial slots in the front and rear walls, this is not a limitation on the invention, and other patterns are possible. The exact pattern of slots and lands formed for a given coil may vary with application and with the desired field profile for the coil. While there is no limit to the width of the slots and lands, narrow slots and wide lands provide better Faraday shielding. Wide slots and narrower lands allow RF magnetic flux to pass and allow for visual, auditory, physical, and other access to/from the coil's interior through it's inner and/or outer walls. Thus, for one embodiment, conducting cavity walls 16O, 16F, and 16R have narrow slots and wide lands, and conducting wall 16I has narrow lands and wide slots. For this embodiment, conducting wall 16I may for example be formed of coaxial tube conductors.

One of the objectives of the coils shown in FIGS. 1A, 1B, 2A, and 2B is to suppress eddy currents in the coil, and in particular in the outer wall thereof, caused by the proximity of the RF coil to gradient coils for the imaging system, and to suppress other low frequency noise in the conductor, such eddy currents/low frequency noise causing image blurring and therefore adversely affecting the signal-to-noise ratio and resolution achievable from a system employing the coil. One way in which such eddy currents have been suppressed in the past is to have the thickness of the conductor for at least outer wall 16O of the coil, and preferably for all walls of the coil, thin enough so as to attenuate the low frequency eddy currents induced by the gradient coil, while still conducting RF currents. This is possible since the skin depth required to conduct signal decreases with increasing frequency, so that if the thickness of the conductor 16 is substantially equal to one skin depth at the resonant frequency to which the coil is tuned, this frequency being a relatively high RF frequency, then the conductor will not pass, and will suppress or attenuate the low frequency gradient field induced signals or other low frequency noise signals.

However, while this mechanism preserves the coil's RF efficiency while attenuating switched gradient induced eddy currents, it alone is not sufficient to fully suppress gradient and/or other low frequency noise for some applications such as fMRI. This objective is facilitated by the slotting or dividing of at least outer wall conducting 16O and preferably by the slotting of this wall and at least end conducting walls 16F and 16R. The slotting of the front and rear conducting walls is desirable to prevent switched gradient induced eddy current flow through or around the ends of the coil. The narrower this slotting (i.e. the greater number there are of nonconducting slots 20, and therefore the narrower the width of each land 18), the more effective this eddy current suppression becomes. The combination of the conductor thickness being substantially equal to one skin depth at the resonant frequency and the slotting of conductor 16, preferably for at least outer wall 16O and end walls 16F and 16R, provides a substantial elimination of all eddy current induced/low frequency noise in RF coil 10, and thus far clearer images and/or faster imaging, then can otherwise be obtained.

Further, in order to achieve increased field strength to 4T, 7T, 9.4T or even higher, it is necessary to be able to operate RF coil 10 with increasingly high frequencies. For example, as previously indicated, for a field strength of 4T, coil 10, when used in an MRI embodiment on the human body, must have a resonant frequency of about 170 MHZ, and this frequency goes to 400 MHZ for a 9.4T field strength. However, for a coil to resonate at these higher frequencies, the reactance of the coil (i.e. its inductance and capacitance) must be relatively low. Such low reactances are either not achievable, or are achievable only for coils so small as to have limited practical application, when lumped inductors and capacitors are used in conventional lumped element circuit designs for the coil. Therefore, distributed capacitance and inductance has been used in distributed element circuit designs to facilitate desired lower reactances. However, while a coil 10 such as that shown in FIG. 1A with distributed reactance can offer higher frequency performance than coils operating with lumped reactance components, even such head and body sized coils have difficulty operating with maximum efficiency at Larmor frequencies corresponding to field strengths above 4 or 5T. The coil 10 reduces this problem by breaking the conducting wall to form a large number of continuous paths, the lands 18 of the walls being connected or formed into N such conductive paths. Breaking the conducting wall to form N conductive paths also improves the homogeneity of the field, the higher the value of N, the more homogeneous the field. N may for example be 16 or 24. FIG. 1A further shows a circumferential or azimuthal slot 22 being formed in for example the center of outer conducting wall 16O, which slot is covered by a collar 24 of a conductive material (the collar 24 being shown in dotted lines in FIG. 1A so that the structure thereunder may be more easily viewed). The slot 22 further breaks up the paths, thus shortening the individual paths and reducing the inductance thereof. The greater number of breaks in each of N paths formed around coil 10, the lower the inductance, and thus the higher the resonant frequency for such coil. Collar 24 may be moved to vary the capacitance formed by the collar, slot 24 and lands 18 of conductor 16, to vary the capacitance of each path, and thus fine tune the resonant frequency thereof. Tuning could similarly be performed by variable or fixed capacitors bridging the gap or gaps in each path. Capacitance for the paths is also determined by the thickness of dielectric filled cavity 12, by the dielectric material in this cavity, by the area and thickness of conductive wall 16, etc.

Distributed inductance is determined primarily by the uninterrupted conductor length and by the width of each path. Thus, assuming that all paths are to operate at the same resonant frequency, the slotting of conductor 16 is selected so that all of the lands 20 are of equal width; however, in applications where different paths are to have different resonant frequencies, for example every other path having a first resonant frequency and the remaining paths a second resonant frequency, every other path could be of a first width to provide the first resonant frequency and the intervening paths of a second width to provide the second resonant frequency. Various parameters of the paths may also be selected or adjusted, including capacitance, inductance, phase, and conductor thickness of at least selected walls, to control relative current carrying or otherwise control field contours or profiles within the coil.

While only a single circumferential/azimuthal slot 22 on the outer wall 16O is shown in FIGS. 1A and 2A, this is not a limitation on the invention, and higher frequency operation can be achieved by having a plurality of circumferential slots 22 for each path. For example, gaps might be provided at selected one or more of points A, B, C in FIG. 1B. Further, there are some advantages in having slot 22 on outer wall 16O of the coil, including the operation of the tuning ring or capacitors 24 being easier from this location, and that the E-field applied to a patient/body in the recess 26 formed by inner wall 16I is significantly reduced, thus reducing detuning caused by the presence of the patient/body in the coil interior and reducing E-field induced noise and heating in the patient or load. This is a problem particularly at higher frequencies since more EM energy is lost (radiated) at higher frequencies for a given coil. However, slots 22 may be at a plurality of locations on outer wall 16O and/or inner wall 16I, on sidewalls 16F and/or 16R and/or at the intersections of these various walls. (See points B, C, FIG. 1B). In some applications these azimuthal slots may be bridged by fixed, variable, or switched discrete inductance and/or capacitance components (see A in FIG. 1B), or by distributed components similar to collar 24, but fixed rather than moveable.

FIG. 2B illustrates a number of variations which are possible in practicing the teachings of this invention. First, the cavity 12 for FIG. 2A is assumed to be filled with a dielectric, the thickness and other dimensions, including volume, of the cavity and the dielectric constant of the dielectric being two of the factors which determine a resonant frequency for each path. FIG. 2B illustrates the cavity 12" as being filled with a fluid, for example a liquid or a gas, having a known dielectric constant. However, a tube 30 connected to a suitable pump may increase or decrease the quantity of fluid dielectric in cavity 12" and/or the fluid pressure in the cavity and/or may alter the spacing between at least semi-elastic cavity walls. Any of these changes alter the dielectric constant or volume of the dielectric in cavity 12", and thus can be used to control the resonant frequency or to tune the resonant frequency of the coil.

Second, the embodiment of FIG. 2B has more clearly defined walls which may for example be separately formed as discussed in conjunction with FIGS. 3A-4B. These separate conductive layers may envelop a solid dielectric cavity core or a fluid filled, for example air filled, cavity core. Corresponding lands on adjacent walls may then be electrically connected, for example directly, capacitively, or inductively, to form the N continuous electrical paths around the coil. While for reasons indicated above, conducting wall 16 would generally be far too thin to provide structural integrity for the coil without a supporting dielectric substrate 14, this is not a limitation on the invention and electrically, all that is required to define cavity 12 is a surrounding conducting wall 16.

While one objective of the invention is to provide distributed capacitances and inductances to achieve higher frequency and thus higher field strength operation, in some applications it may be desired to operate a coil of this invention at a lower resonant frequency to, for example, permit operation at a lower field strength for a given application, while still achieving the other advantages of this invention. Adding discrete reactance, for example the added lumped (fixed, variable, or switched) capacitance (or inductance) elements 32 shown in FIG. 2B, may be utilized both to achieve a desired reduced frequency operation and to tune the paths to a desired lower resonant frequency. A capacitor 32 could for example be provided for each of the N paths or, where operation at more than one frequency is provided, the capacitor 32 might only be in the paths to be operated at the lower of the frequencies, or the capactance might be one value for one frequency, and another value for another frequency. For example, if every other path is to have a resonant frequency at a first higher frequency and the remaining alternate paths to be resonant at a second lower frequency, capacitors 32 might appear only for the alternate paths to be operated at the second lower frequency, or capacitors of alternating values may appear on alternating elements to tune two frequencies for the coil. Further, while the embodiment of FIG. 2B has only a single azimuthal slot 34 for each path and a single lumped capacitance or inductance element 32, additional azimuthal slots could also be provided for this embodiment to for example shorten path lengths, and these slots or gaps could be bridged by appropriate lumped reactance elements, lumped capacitance elements being shown for bridging gaps 34, or could be bridged by distributed reactance elements such as for the gaps of FIGS. 2A, 3B. Except for the differences discussed above, the embodiments of FIGS. 2A and 2B are otherwise substantially the same and operate in substantially the same manner to achieve the benefits of this invention.

FIG. 3A illustrates a conducting wall 16 which is typically used as an outer wall 16O, but sometimes used as an inner wall 16I for a coil 10. FIG. 3B illustrates a transmission line conductor 16I which is most often used at the inside wall for the volume coils 10 and 10'. These conductors differ from the conductors 16 discussed earlier in that each is made up of an inner layer and an outer layer separated by a dielectric to form transmission line elements. For the wall 16 of FIG. 3A, the slots for the outer layer are shown in solid lines while the slots for the bottom or inner layer are shown in dotted lines. The figure therefore shows these layers as being staggered so that the slot of one layer is overlaid by a land of the other layer. This provides superior RF efficiency and Faraday shielding for the confinement of fields generated by the RF coil. Similarly, for FIG. 3B which shows a conductor preferably used for the inside wall of the coil to form conducting wall 16I, the solid outer conductor is slotted both longitudinally and circumferentially, while the dotted bottom conductor is slotted only longitudinally, with lands on each side of the conductor overlying slots on the opposite side. The double-sided conductors, with lands on the conductor for one side overlying slots for the conductor on the other side, also applies for the two end walls as illustrated in FIGS. 4A and 4B, FIG. 4A being for example conducting rear wall 16R, and FIG. 4B showing conducting front wall 16F of a coil suitable for example for head imaging. While not shown, slots may also be provided in various of the radial lands for the end walls to shorten path lengths. The degree of overlap for lands on opposite sides of each double-sided conductor controls capacitance, and thus resonant frequency, for the conductive paths. The degree of overlap on the outside and end walls of the cavity improve the RF conduction, efficiency and shielding of the cavity. In addition to, or in lieu of, overlapping conductive lands on double sided cavity walls, capacitors can be used to bridge the slots or gaps between the lands to provide additional RF conduction or alternate RF paths across these slots.

Figure 3C:
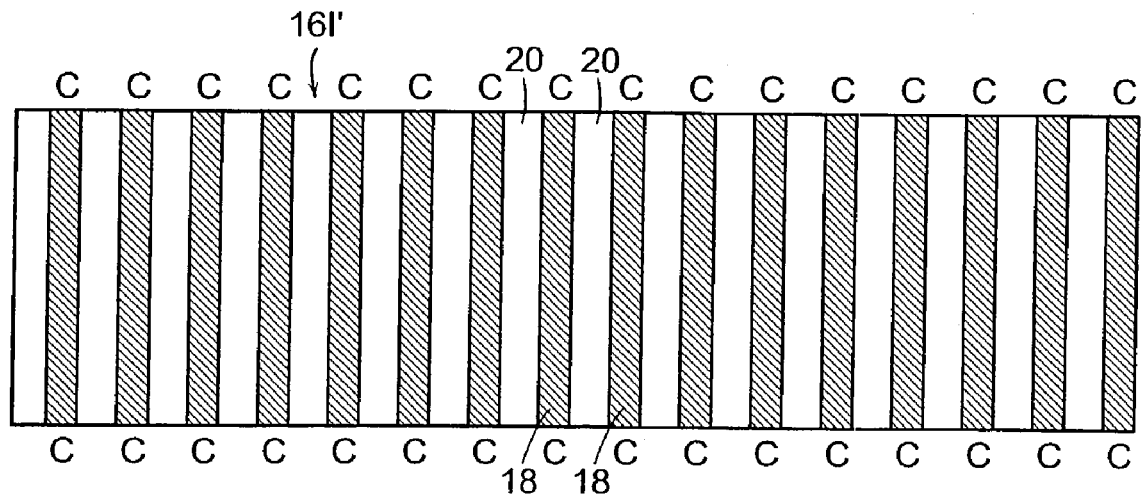
FIGS. 3C and 3D are illustrations of slotted conductor configurations for an alternative embodiment.
Figure 3D:
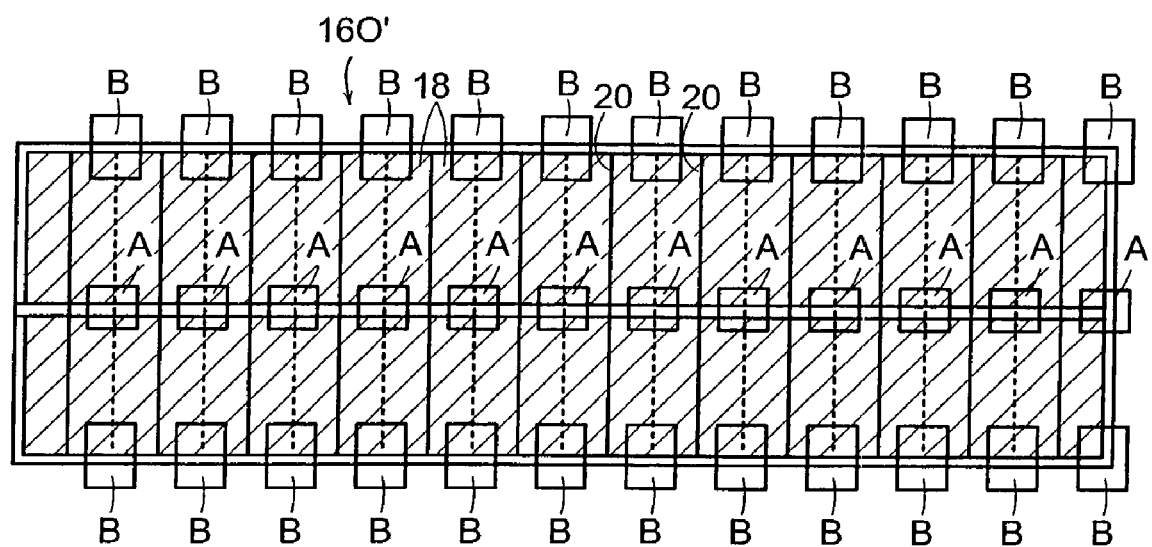

FIGS. 3C and 3D show a conducting outside wall 16 O' and a conducting inside wall 16 I' for an alternative embodiment of the invention. Wall 16 O' is slotted into multiple overlapping layers, as for wall 16 O (FIG. 3A) but with additional azimuthal slotting. Bridging capacitance can be added across the horizontal azimuthal gaps at for example points A, B, and/or C, or anywhere else such gaps appear, and can function to tune the coil/path to a desired frequency. Placing lumped or distributed capacitance at these outside wall positions has the added benefit of moving capacitive sections of the coil away from the patient's head or body. Wall 16 I' is shown as single-sided printed line segments. This inside wall embodiment places the more inductive inside wall surface of the coil nearer to the coil load (for example the patient), while the more capacitive outside and/or end walls of the coil are away from the load. The end walls of FIGS. 4A, 4B may be used with the outer and inner walls 16 O' and 16 I' and the walls 16 O, 16 I may be used together or with other inner/outer wall embodiments depending on application.

FIG. 4A also illustrates another optional feature of the invention in that the conducting rear wall 16R can be an open wall like FIG. 4B, or a closed wall, this closed wall acting as an RF mirror which permits the length of the cavity to be shorter. The shortened coil facilitates decreased electrical path lengths for all circuits, thus facilitating higher efficiency, higher frequency operation and thus higher field strength operation. In this case, a physically shortened coil is also an electrically shortened coil (in wavelengths) and therefore a more efficient coil for a given higher frequency and larger dimension such as a human head sized coil operation at 128 MHz or higher.

Particularly where the coil is being utilized to image the head or brain of a patient, the coil being shortened in this way provides ergonomic benefits in that it permits at least the patients mouth and sometimes nose/eyes, to be outside of the coil, reducing the claustrophobic feeling sometimes experienced by patients in such imaging machines, and also facilitating easier breathing by the patient through the mouth or nose if exposed. This design also permits an optical mirror to be mounted within visual range of the patient to permit visual stimuli to be provided to the patient, something which is required for various brain imaging applications, without requiring a transparent section in the coil. Since it is necessary to have the coil's current pass through a conductive film or screen covering these transparent regions, the patient is not afforded an unobstructed view of visual stimuli for example in some fMRI studies The shortened coil is thus highly advantageous. However, if the coil design is such as to extend over the patient's eyes, patient visibility maybe enhanced by providing thin conductors for the conducting wall 16 in areas over the patient's eyes; the conducting wall 16 in this area for example being formed by thin, substantially parallel tubes or coaxial conductors. Alternatively a transparent section such as a view port over the face of a human can be provided in various ways, including 1) through widened slots (thin conductors) for the inside and outside walls over the face, 2) through widened slots or gaps between elements in the inside wall and a continuous or slotted conductive screen window in the outside wall, or 3) through transparent conductive elements, continuous or slotted, for inside and outside walls of the cavity.

As seen in FIG. 4A, the rear wall has a unique slotting pattern, with the slotting extending over substantially the entire end wall. The rear wall with this unique slotting pattern contributes to the resonant frequency of each path. The coil with the closed end wall is also more efficient in that it limits radiation loss which might otherwise occur through the end wall, the closed end wall also enhancing coil symmetry and thus facilitating tuning of the paths. This follows from the fact that all of the coil elements or paths are symmetrically referenced to the same ground plane. Finally, since the patient's mouth can extend beyond the coil, a bite bar can be provided to reduce patient head movement, something which facilitates signal averaging and diminishes motion artifacts. Without the ability to maintain the patient's head absolutely still, applications involving multiple images, such as for example fMRI, can provide erroneous results.

FIG. 5A illustrates a number of features of the invention, including preferred ways for applying RF drive signals and for outputting received RF signals from the coil, and techniques for switched detuning of the coil in applications where the coil is being used for either transmit or receive but not both simultaneously. In particular, instead of applying drive signal to only one of the paths 18 and relying on inductive coupling to couple the RF signal to the remaining paths, FIG. 5A shows a technique for applying RF drive signal simultaneously to multiple paths. In particular, an RF drive (transmit) signal on line 40 is passed through transmit/receive switches 42 to a 180° splitter 44 which divides the signal into two signals 180° out of phase with each other. The outputs from splitter 44 are split again into quadrature hybrids 46A and 46B to drive four line elements or paths 18 separated by 90° azimuth angles. Since the electrical phase difference for the signals applied to each of the paths corresponds to the angular separation between the paths, the transmit mode is circularly polarized. A second 180° splitter 48 combines the quadrature combined receive channels passing through the quadrature hybrids 46 to a common receive channel 50 which is passed through switches 42 to receive output line 52. Transmit and receive lines 40, 52 are decoupled from the power amplifier and the preamplifier respectively by transmit/receive switches 42. In a body coil application for example, these switches will have the attributes of low loss, high speed and very high power ratings, while requiring low switch bias voltages. All of the components of the drive circuit should be non-magnetic and can be mounted close to the back of coil 10.

While for the illustrative embodiment shown in FIG. 5A, circularly polarized drive signals have been applied to four evenly spaced paths on coil 10 for improved homogeneity, all that is required for circular polarization, is that the paths to which signal is applied be in relative quadrature phase. The number of paths coupled electrically to the power amplifier or power amplifiers and the receiver or receivers may be any number between 1 and N where N is the number of elements or paths 18 in FIG. 5A. Thus, assuming 16 paths for an illustrative embodiment, signal could be applied to 2, 4, 8, or 16 paths for balanced quadrature operation, or could be applied to another number of coils. Transmit signal amplitude, phase angle, and drive paths can be selected for maximum homogeneity, or for targeting a desired region of interest in the body or other test object. Similarly, the receive paths and phase angles can be chosen for overall homogeneity, or for highest sensitivity reception from a specific region of interest. In addition, while signals are shown applied to a sidewall of the paths, signal can be applied at various points on the paths, it being currently preferred that they be applied to inner conducting wall 16I at a point near its junctions with a sidewall.

Further, the signal on each of the lines is shown as being capacitively coupled to the corresponding path through a variable capacitor 54. While capacitive coupling is shown, any reactive coupling (capacitive or inductive) can be used. Operation at two or more frequencies can be achieved for the coils in FIGS. 1, 5a, by changing the electrical path lengths for alternating paths for each frequency desired. For example, for a double tuned coil, all odd numbered paths would be adjusted or tuned to one electrical length or frequency. All even numbered paths would be tuned to a second frequency. This tuning can be achieved by adding or subtracting, inductance or capacitance in the respective paths. Operation at two different frequencies may also be achieved by having at least one wall of the resonant cavity of greater than one skin depth, and by having a dielectric constant within the cavity different than that of air outside of the cavity. This results in a signal wavelength on the inner surface of the conductive cavity wall facing the inner dielectric to be different (in frequency) to the signal wavelength on the cavity wall facing the outer air dielectric. This results in the cavity being resonant at two different frequencies.

In the discussion so far, it has been assumed that coil 10 is being used both as a transmit coil and as a receive coil. However, in some applications, particularly where homogeneous excitation of, and high sensitivity detection from, localized regions of interest (ROI) is required, separate coils may be utilized for transmit and for receive. The coil 10 would more typically be used as a transmit coil, with for example a phased array or other appropriate receive coil such as is shown in FIG. 6 being placed adjacent the area being imaged on the body. The receive coil may have varying numbers of coil loops of varying shapes depending on application. In some applications a coil 10 might only be used as a receive coil.

One problem when separate transmit and receive coils are used together is that destructive reactive coupling may occur between the two coils which can interfere with the imaging and eliminate the sensitivity benefits achievable from having a separate receive coil. It is therefore necessary to RF field decouple the transmit and receive coils from each other. This field decoupling can be accomplished by orienting the spatial position of one coil relative to the other, by manipulating the electrical phase relations of one coil relative to the other, by changing the field amplitude of one coil relative to the other, by changing the resonant frequency of one coil relative to the other and/or by temporal separation of the field of one coil relative to the other by any combination of the above techniques. While mechanical means, including relative spatial manipulations of the two coils or mechanical switching or reorienting of the phase, amplitude and/or frequency of the coil, current, voltage and RF fields might be utilized to effect the field decoupling of the two coils, for preferred embodiments the decoupling is accomplished electrically or electronically. The actuation or control of such decoupling may be by PIN diodes, solid state switches such as transistors, and semiconductor relays, tube switches, electromechanical relays, varistors, etc. In addition to the "active" electronic components indicated above, "passive" components may also be used, including small signal diodes, limiter diodes, rectifier diodes, etc., these components often being used together with quarter-wave circuits.

Further, by the general methods above, coil coupling can alternatively be maximized for some applications. For example, it may be desirable for coil 10 to be strongly coupled to a remote or implanted surface coil where transmission-line coupling may be impractical.

Because of its speed, power handling, compactness and non-magnetic packaging, the PIN diode is a good choice for many decoupling circuit implementations, including ones involving a coil 10. Such PIN diode circuits can be used to change the electrical length of a coil or its individual paths, and to thus change the resonant frequency of one coil relative to the other coil, decoupling in this case being effected by frequency shifting. A PIN diode circuit can also be used to open circuit or short circuit a coil or individual paths thereof to effectively switch the coil on or off, thereby decoupling it from the other coil. Similarly, PIN diodes may be used to shift the phase of coil currents to minimize the coupling between two coils.

FIG. 5A shows one way in which a PIN diode 56 may be utilized to detune the paths 18 of coil 10, a separate PIN diode switched circuit 56 being provided for each path 18 for this embodiment. Each PIN diode shorts two points on the corresponding path when conducting, for example a point on an inner wall to a point on a side wall or outer wall, thereby altering the effective length, phase or impedance of the path and thus its resonant frequency.

FIG. 5B shows that this detuning technique can be used with a coil of the type shown in U.S. Pat. No. 5,557,247, each transmission line element 57 having an inner conductor 59 and an outer conductor 61 separated by a dielectric 63. Each PIN diode 56 for this embodiment is connected through a solder post 60 to short outer conductor 61 through choke coil 62 to a conductor 64 on rear wall 68 of the coil. The diodes are current forward biased to short the path, thus dramatically altering the coil's resonant frequency, and thus decoupling the coil from another coil, a transmit or receive coil of the same operational frequency. The resonant frequency of each path may be quickly restored by voltage back biasing the diode to disconnect the conductor 61 from the cavity wall. This PIN diode switching approach is effectively changing the impedance across an equivalent gap or azimuthal slot located in the paths at position "C" in FIG. 1B. This or a similar approach using a PIN diode circuit to change the impedance (higher or lower) in some or all of the paths can be affected at other gap positions in the paths such as A or B.

While in FIGS. 5A and 5B, PIN diodes 56 are used to short paths 18 for detuning, PIN diodes could also be used to effect detuning by placing the diodes in the path, for example two walls being connected through a PIN diode for each path, the path being open circuited for detuning. The PIN diodes could be used to quickly switch reactance into or out of each path to change its resonant frequency, or the PIN diodes could be utilized to effect detuning in other ways. Further, for the embodiment shown in FIG. 5A, detuning may be effected by reversing the phase for the RF drive signals applied to the various paths 18 so that electrical phase is out of phase rather than in phase with the azimuthal separation of the paths.

In the discussion so far, coil 10 has been assumed to have a closed tubular configuration with an RF field mode M=1 or greater, so that field is applied to a body position within the coil. However, this is not a limitation on the invention and the coil could be designed to operate in an M=0 mode for example, as taught in U. S. Pat. No. 5,744,957. In particular, by, for example, not slotting the inner wall 16I of the coil, or by having a two layer overlapping inner conductor as shown in FIG. 3A, the RF field can be confined in the cavity 12 to circulate therein, field not exiting the cavity except where an opening is provided in one of the walls of the cavity through which the field may exit or through which a body to be imaged may be inserted into the cavity to be exposed to the field circulating therein. Referring to FIGS. 7A and 7B, the coil 70 may be flat as shown, may have a slight curvature, may be flat with a circular, elliptical or other appropriate shape rather than a rectangular shape as shown or may have some other appropriate shape so as to fit on the body being imaged with minimal spacing, thereby achieving optimal coupling between the coil and the body to be imaged, eliminating losses resulting from dielectric constant mismatches and spaces between the coil and the body. Coil 10 may for example be flattened to achieve a flat shape. The resonant cavity of this invention may thus have a wide variety of sizes and shapes, modes of operation, conductor patterning, apertures, etc. Any cavity coil geometry is allowable provided that an RF field can be generated therein which can be made useful for MRI or EPR imaging applications. One or more openings 72 may be provided in a wall of coil 70 which wall is to be adjacent to or in contact with the body being imaged, each opening 72 being adjacent a portion of such body on which imaging is desired. Holes are preferably at B1 magnetic field nodes of the cavity wall. Where the portion of the body on which imaging is desired is a projection on the body, for example a woman's breasts, opening 72 may be positioned as shown in FIG. 7B to permit such projections to enter cavity 12 through the openings so as to be in the field path in the cavity. The dielectric material in the cavity may be shaped or deformable to fit projections extending into the cavity, minimizing dielectric (impedance) mismatch. Openings 72 are strategically located and dimensioned to both encompass the body portions to be imaged and to be properly phased. Openings 72 might also be used on an inside or outside wall of a coil 10 designed to operate in M=0 mode or in a side wall.

In one application, apertures in for example a side wall of a coil are each dimensioned to hold an experimental mouse, or the mouse's head only, to permit a plurality of mice to be batch/simultaneously imaged. In particular, referring to FIGS. 9A and 9B, an embodiment of the invention is shown which is suitable for batch nuclear magnetic resonance (NMR) study of multiple laboratory samples, which samples may for example be held in test tubes, or of lab animals such as mice. The coil 100 is of the type previously described and has a cavity which is filled with a dielectric material, which material can be a gas such as air, a fluid or a solid. The dielectric material is preferably matched to the sample to minimize the electrical impedance boundary between the sample and the cavity for improved performance. A solid dielectric can serve as the support wall for sample spaces 102. As for previous embodiments, 16O, 16I, 16F, and 16R are the outer wall, inner wall, front wall and rear wall, respectively, of the cavity. For this embodiment, these walls may be slotted to break up eddy currents and shield the sample, as for the prior embodiments, or may be continuous. The space or recess 26 inside wall 16I is not used for this embodiment. While end wall 16F may be a conducting wall, for example having slotted conductors between the sample spaces 102 as shown in FIG. 9B, either in addition to or instead of wall 16F being conductive, a conductive lid 104 may be provided which is mounted to wall 16F in a manner to provide a good electrical connection, for example being press-fitted. The lid aids the coil's performance by completely enclosing the coil cavity 12 and thus more efficiently sealing energy in the coil. Where front wall 16F is conductive, the lid could be non-conductive. The lid could also be segmented, but this would require greater care in mounting the lid to assure the lid segments align with the coil segments.

The embodiment of FIGS. 9C and 9D is substantially the same as the embodiments previously described, for example in conjunction with FIGS. 1-4B, and in particular has an inner wall configuration which is substantially the same as that of FIG. 3C. For this embodiment, the useful space where a sample would be placed is the center space 26, requiring inner wall 16I to be constructed of conductive lands, tubes or transmission line elements 18 separated by slots 20 wide enough to allow magnetic flux to efficiently fill space 26. Outer wall 16O and end walls 16F and 16R could be any of the configurations previously described, depending on application. FIGS. 9C and 9D further illustrate the use of a lid 104 with these embodiments of the invention, which lid may be conductive or non-conductive and serves the same functions as those performed by the lid 104 of FIG. 9A. FIG. 9D also illustrates an optional solid back wall 106 which also may be continuously conductive or slotted for the reasons previously discussed.

FIGS. 9E and 9F illustrate still another embodiment of the invention. For this embodiment, center space 26 is filled with a dielectric 108 having sample spaces 110 formed therein. Sample spaces 110 may extend completely through dielectric 108 or may extend only partly through the dielectric as for spaces 102. While for the embodiment shown, dielectric 108 is solid, the gas/air or liquid dielectric is utilized, sample spaces 110 can be formed of non-conducting walls or the sample can be immersed in the gas or liquid dielectric. For some embodiments, sample spaces 110 may be tubes through which sample passes in a continuous NMR monitoring process of a gas, liquid or solid sample flow or conveyance. The cavity walls 16 for the embodiment of FIGS. 9E, 9F would be substantially the same as those for the embodiment of FIGS. 9C, 9D and, as for this prior embodiment, will vary with application. Also, as for the prior embodiments shown in FIG. 9, the lid 104 is optional, performing the same functions if utilized as for the prior embodiments.

FIG. 10 illustrates several transmission line stub embodiments of the invention which may for example be used for NMR microprobe applications, permitting small samples to be efficiently measured. Each of the transmission line stub embodiments 120, 120A-120C, may be capped with a conductive cap 104 to short-circuit its center conductor 122 with its outer conductor 124. Alternatively, the cap may be spaced or constructed in a manner such that the center conductor and outer conductor of the transmission line are left open-circuited or the cap may be eliminated completely. The stub is preferably tuned and matched such that the maximum current, and therefore maximum RF magnetic field, is located at the sample end of the stub. For the current to peak at the end, the length of the stub should be approximately a one half wavelength or be electrically adjusted to be, a full wavelength increment of the resonant frequency for an open stub and one quarter wavelength or three quarter wavelength for a shorted stub. The stub is typically connected to a transmission line to or from the NMR system by a coaxial connector 126 which is best seen in cross-sectional view 10D. A variety of coaxial connectors known in the art might be utilized.

The sample spaces may be located within the dielectric space 128 between the conductors as shown in FIGS. 10A and 10B, or may be located in a hollow, slotted center conductor as shown in FIG. 10C. More particularly, outer wall 124 is the outer conductor or shield of a typical coaxial transmission line. The inner wall is a center conductor 122 of a typical coaxial line. The dielectric may be, as for prior embodiments, gas, liquid or solid and impedance matched to the sample. In a typical coaxial line, the dielectric is solid and the sample space would be cut or drilled into the dielectric material. The sample space 130A for the embodiment of FIG. 10A is the space between the inner and outer conductors at the end of the coil. The sample space 130B for the embodiment of FIG. 10B are multiple sample spaces formed in the dielectric around the center conductor. For the embodiment of FIG. 10C, the center conductor 122 is a slotted or multi-element conductor, the sample space 130C being within the hollow end of the center conductor.

While in the discussion above it has been assumed that the number of lands on each wall of the coil is the same so that N continuous RF electrical paths are formed around the coil, this is not a limitation on the invention. In particular, the number of lands formed on each wall of the coil may not be the same. Thus, the outer wall may have a first number of lands $N_1$ and the inner wall may have a second number of lands $N_2$. The side walls may also have $N_1$ lands for reasons previously indicated. $N_1$ may, for example, be selected at least in part to effectively breakup up low frequency eddy and other currents induced in the coil, while $N_2$ is generally selected to achieve a desired magnetic field pattern. Even where $N_1$ and $N_2$ are not equal, adjacent paths on the walls are still connected to form a plurality of continuous electric paths around the coil, these paths providing various ones of the advantages previously indicated.

As has been indicated earlier, one advantage of a coil 10 in accordance with the teachings of this invention is that it can provide a uniform, homogeneous field inside the coil for imaging purposes. While such a homogeneous field is advantageous in many applications, there are applications where some other field pattern is desirable. Achieving such a patterned field through use of spacing and polarization of the paths to which signals are applied and the phasing of such signals has been discussed earlier. The field may also be patterned by the choice, positioning, and control of the dielectric in cavity 12 to obtain a desired field pattern. Still another way of controlling field pattern is illustrated in FIG. 8 where a dielectric "pillow" 80 is shown inside of coil 10 which dielectric is not part of cavity 12 and is selected to provide a good dielectric match with body/patient 82 and/or with the dielectric in cavity 12. The effect of dielectric pillow 80 is to concentrate or otherwise manipulate the RF magnetic flux in a region of interest in the patient's head where, for this embodiment, imaging is desired. Dielectric inserts could be otherwise positioned between coil 10 and the portion of a body on which imaging is to be performed, or even within cavity 12, to concentrate or manipulate field in such areas, thereby enhancing measurement sensitivity in these regions of imaging and/or to minimize field coupling to areas which are not to be imaged. The shape of the insert, as well as its dielectric constant, is a factor in achieving the desired control and shaping of the Rf field, the shape of the insert also being useful to restrain body motion, which motion, as previously indicated, can adversely affect imaging.

Another potential problem with MRI and other imaging systems utilizing RF coils is that rapidly switched currents in the field gradients can generate intense acoustical noise. Such noise is often annoying to a patient or even painful. One way in which such noise can be reduced is by utilizing an acoustic damping material in cavity 12 as at least part of the dielectric therein, such acoustic dampening material either forming the entire dielectric, or being used in conjunction with other dielectric material in order to achieve a desired dielectric constant or pattern of dielectric constants in the cavity so as to provide a desired resonant frequency, field pattern and/or other features of the invention.

Thus, while the invention has been particularly shown and described above with reference to illustrative and preferred embodiments, the foregoing and other changes of form and detail may be made therein by one skilled in the art while still remaining within the spirit and scope of the invention, which is to be defined only by the appended claims.

What is claimed is:

1. An RF coil for use in an imaging system including:
    a cavity formed as a conductive enclosure defined by an outer wall, an inner wall, a first end wall and a second end wall, said inner wall defining a sample-receiving chamber, said first end wall being open adjacent said chamber to provide access thereto, and said second end wall being closed to seal the chamber at its second end, the closed second end wall functioning as an RF mirror;
    at least one electrical conductor for each of said walls, electrical conductors on adjacent walls being electrically coupled to form at least one continuous electrical path around the cavity; and
    a port through which RF signal is applied to at least one said electrical path; and further wherein the electrical conductors for each said wall are slotted to form a pattern of conductive lands on each wall, the pattern on said second end wall being a radial slotting pattern covering at least most of said wall.

2. An RF coil for use in an imaging system including:
    a dielectric filled cavity formed as wall surrounding the dielectric, which wall is formed at least in part of an electrical conductor, said electrical conductor forming at least one continuous electrical conducting path around said cavity, field applied to said at least one electrically conducting path causing a selected alternating magnetic field in said cavity, and at least one aperture formed in at least said electrical conductor through which said magnetic field may be applied to an adjacent body, wherein said at least one aperture is positioned at a node of said magnetic field.

3. An RF coil as claimed in claim 2 wherein said coil is shaped to a body surface being imaged, said surrounding wall including connected top and bottom walls, said at least one aperture being formed in only said bottom wall.

4. An RF coil as claimed in claim 3 wherein said coil is flexible to conform to a surface of a body being imaged.

5. An RF coil as claimed in claim 3 wherein said at least one aperture are arranged to be adjacent areas to be imaged of a body being imaged.

6. An RF coil as claimed in claim 5 wherein said areas to be imaged are at least one projection on said body, a projection to be imaged extending into said cavity through an adjacent aperture.

7. An RF coil as claimed in claim 6 wherein said dielectric is conformable to an outer surface of a projection extending into said cavity so as to minimize discontinuity between the projection and the dielectric.

8. An RF coil as claim 2 wherein said coil is in the form of a closed loop, said surrounding wall including connected inner and outer walls, said at least one aperture being formed in only one of said inner wall and said outer wall.

9. An RF coil as claimed in claim 2 wherein said at least one aperture are arranged to be adjacent areas to be imaged of a body being imaged.

10. An RF coil as claimed in claim 2 including a lid mounted to at least one end of the coil.

11. An RF coil as claimed in claim 10 wherein said lid is at lest partially conductive.

12. An RF coil as claimed in claim 2 including a plurality of sample spaces formed in said dielectric at a selected portion of said enclosure.

* * * * *

UNITED STATES PATENT AND TRADEMARK OFFICE
CERTIFICATE OF CORRECTION

| | | |
|---|---|---|
| PATENT NO. | : 7,268,554 B2 | Page 1 of 1 |
| APPLICATION NO. | : 10/367489 | |
| DATED | : September 11, 2007 | |
| INVENTOR(S) | : John T. Vaughan | |

It is certified that error appears in the above-identified patent and that said Letters Patent is hereby corrected as shown below:

In the Specifications:

Column 1, line 3, before the title "Related Applications", insert the following paragraph -- This invention was made with government support under CA076535 awarded by the National Institutes of Health. The government has certain rights in the invention. --

Signed and Sealed this
Thirtieth Day of April, 2013

Teresa Stanek Rea
*Acting Director of the United States Patent and Trademark Office*